US006806709B2

(12) United States Patent
Markl et al.

(10) Patent No.: US 6,806,709 B2
(45) Date of Patent: Oct. 19, 2004

(54) FLOW IMAGING USING BALANCED PHASE CONTRAST STEADY STATE FREE PRECESSION MAGNETIC RESONANCE IMAGING (75) Inventors: Michael Markl, Palo Alto, CA (US); Norbert J. Pelc, Los Altos, CA (US); Marcus Alley, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/317,463

(22) Filed: Dec. 11, 2002

(65) Prior Publication Data

US 2004/0113613 A1 Jun. 17, 2004

(51) Int. Cl.[7] .................................................. G01V 3/00
(52) U.S. Cl. ....................................... 324/309; 324/307
(58) Field of Search ................................ 324/309, 307, 324/300, 318, 306, 312; 128/653

(56) References Cited

U.S. PATENT DOCUMENTS

| 4,973,906 A | * | 11/1990 | Bernstein ..................... 324/309 |
| 5,225,779 A | * | 7/1993 | Parker et al. ................ 324/306 |
| 5,391,989 A | * | 2/1995 | Takane et al. ............... 324/306 |

OTHER PUBLICATIONS

Markl et al., "Balanced Phase Contrast Steady State Free Precession (PC–SSFP): Velocity Encoding by Gradient Inversion," ISMRM, May 2002.
Grant Proposal: Kyle Mann Grant, "Assessment fo Morphology and Function in Patients with Marfan Syndrome with Magnetic Resonance Imaging (MRI)" Unpublished.
Fellowship application, Applications for a DFG (Deutsche Forschungsgemeinschaft) postdoctoral fellowship, filed in Germany, Jun. 2000, not publicly available per German Funding Agency based on information and belief of Michael Markl, Applicant.
Markl et al., "Balanced Phase Contrast Steady State Free Precession (PC–SSFP): Velocity Encoding by Gradient Inversion," Magnetic Resonance in Medicine 49: 945–952 (2003).

* cited by examiner

Primary Examiner—Brij B. Shrivastav
(74) Attorney, Agent, or Firm—Beyer Weaver & Thomas LLP (57) ABSTRACT A novel technique for velocity measurements (PC-SSFP) is disclosed that combines CINE Phase Contrast (PC) MRI and balanced Steady State Free Precession (SSFP) imaging. Flow encoding is performed without the introduction of additional velocity encoding gradients in order to permit data acquisition with short TR comparable to repetition times of typical SSFP imaging sequences. Sensitivity to through plane velocities is instead established by inverting (i.e. negating) all gradients along the slice select direction. Velocity sensitivity (venc) can be adjusted by altering the first moments of the slice select gradients. Disturbances of the SSFP steady state are avoided by acquiring different flow echoes in consecutively (i.e. sequentially) executed scans, each over several cardiac cycles, using separate steady state preparation periods. Comparison of phantom measurements with those from established 2D-CINE-PC MRI excellent correlation between both modalities. Results of volunteer examinations exhibit advantages of PC-SSFP, which include the intrinsic high signal to noise ratio (SNR) of balanced SSFP and consequently low phase noise in measured velocities. An additional benefit of PC-SSFP is its lower reliance on in-flow dependent signal enhancement, therefore yielding more uniform SNR and better depiction of vessel geometry throughout the whole cardiac cycle in structures with slow and/or pulsatile flow.

12 Claims, 5 Drawing Sheets

FLOW IMAGING USING BALANCED PHASE CONTRAST STEADY STATE FREE PRECESSION MAGNETIC RESONANCE IMAGING

STATEMENT AS TO RIGHTS TO INVENTIONS MADE UNDER FEDERALLY SPONSORED RESEARCH OR DEVELOPMENT

The U.S. Government has rights in the claimed invention pursuant to NIH grants No. P41 RR09784 and R01 HL46347 to Stanford University.

CROSS-REFERENCES TO RELATED APPLICATIONS

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

This invention relates generally to magnetic resonance imaging (MRI), and more particularly, the invention relates to flow imaging using a phase contrast Steady State Free Precession MRI sequence.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

Figure 10A:
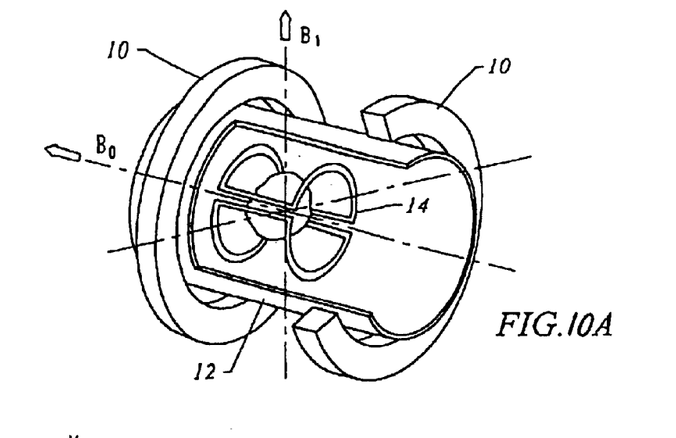
FIG. 10A is a perspective view partially in section illustrating conventional coil apparatus in an NMR imaging system.
Figure 10B:
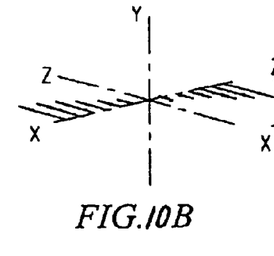
FIGS. 10B–10D illustrate field gradients which can be produced in the apparatus of FIG. 10A.
Figure 10C:
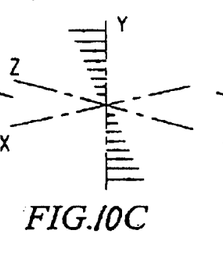
Figure 10D:
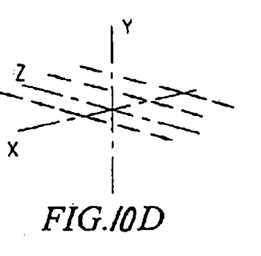

FIG. 10A is a perspective view partially in section illustrating conventional coil apparatus in an NMR imaging system, and FIGS. 10B–10D illustrate field gradients which can be produced in the apparatus of FIG. 10A. This apparatus is discussed by Hinshaw and Lent "An Introduction to NMR Imaging: From the Block Equation to the Imaging Equation." *Proceedings of the IEEE*, Vol. 71, No. 3, March 1983, pp. 338–350. Briefly, the uniform static field $B_0$ is generated by the magnet comprising the coil pair 10. A gradient field G(x) is generated by a complex gradient coil set which can be wound on the cylinder 12. An rf field $B_1$ is generated by a saddle coil 14. A patient undergoing imaging would be positioned within the saddle coil 14.

In FIG. 10B an X gradient field is shown which is parallel to the static field $B_0$ and varies linearly with distance along the X axis but ideally does not vary with distance along the Y or Z axes. FIGS. 10C and 10D are similar representation of the Y gradient and Z gradient fields, respectively.

Figure 11:
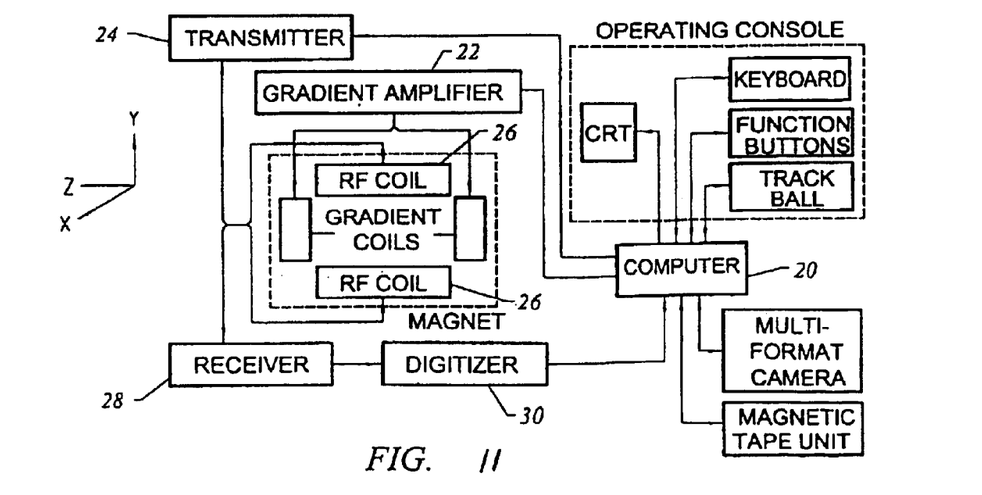
FIG. 11 is a functional block diagram of conventional imaging apparatus.

FIG. 11 is a functional block diagram of conventional imaging apparatus as disclosed in NMR-A Perspective in Imaging, General Electric company. A computer 20 is programmed to control the operation of the NMR apparatus and process FID signals detected therefrom. The gradient field is energized by a gradient amplifier 22, and the rf coils 26 for impressing an rf magnetic moment at the Larmor frequency are controlled by the transmitter 24. After the selected nuclei have been flipped, the rf coil 26 is employed to detect the FID signal which is passed to the receiver 28 and thence through digitizer 30 for processing by computer 20.

Investigation of blood flow in the heart and vessels can provide insight in the function of the cardiovascular system. Magnetic resonance imaging with multidirectional CINE velocity mapping can be used to study relationships between aortic and left ventricular blood flow patterns and the geometry of the thoracic aortic aneurysms and grafts. Recognizable altered flow patterns were found to be associated with altered vessel geometry. The results of velocity mapping of aortic wall motion as well as pulse wave velocities can be combined with distensibility and stiffness index in order to find potential correlations of these parameters.

Fully balanced Steady State Free Precession (SSFP) imaging has recently gained increased importance due to its high signal-to-noise ratio (SNR). The gradient waveforms have zero net area in each repetition time (TR) interval and are first order moment nulled along read and slice direction at each rf excitation.

BRIEF SUMMARY OF THE INVENTION

The inventors recognized, however, that during data acquisition, SSFP sequences are motion sensitive and the MR-signal exhibits a motion related phase depending on the first moments of the gradient activity between rf-excitation and data readout. Flow or motion quantification can thus be accomplished but, as in conventional phase contrast (PC) MRI, a method to remove other phase shifts (e.g. due to off-resonance) is needed. In accordance with the invention, a novel technique for velocity measurements (PC-SSFP) combines CINE phase contrast (PC) MRI and balanced Steady State Free Precession. Sensitivity to through plane velocities is established by inverting (i.e. negating) the slice select gradient for consecutively executed balanced SSFP pulse sequences. Velocity sensitivity (venc) can be adjusted by increasing the first moments of the slice select gradients. Comparison of measurements on phantoms with those from established 2D CINE MRI demonstrated excellent correlation between both modalities. Advantages of PC-SSFP include the intrinsic high signal to noise ratio of balanced SSFP and consequently low phase noise in encoded velocities.

Velocity encoding in the slice direction is performed by data acquisition with two SSFP sequences which differ only in the sign of all gradients along the slice selection direction. First moments $M_1^+$ and $M_1^-$ associated with the slice selection gradients are thus altered accordingly. As a result phase difference images $\Delta\phi$ can be calculated which are directly related to the velocity $v_2$. Similarly, velocity in the readout direction can be encoded by performing two sequences which differ only in the sign of all the gradients along the readout direction. Velocity effects in the phase encoded direction can be achieved by applying a bipolar lobe in this direction prior to readout whose effect is undone by a bipolar lobe after readout. Velocity encoding in the phase encoded direction is achieved by data acquisition with two SSFP sequences which differ only in the amplitude or sign of the bipolar lobes.

Different velocity sensitivities in the slice select direction can be realized by lengthening the plateau of the slice selection gradient and adjusting refocusing and prefocussing gradients accordingly while keeping the rf-pulse width constant and thus keeping TR at a minimum, or by changing the rf-bandwidth and gradient strength. Similarly, different velocity sensitivities in the readout direction can be achieved by controlling the length and amplitude of the gradients in this direction in conjunction with appropriate control of the readout bandwidth. Different velocity sensitivities in the phase encoded direction are achieved in a straight forward manner by control of the bipolar lobes.

The invention and objects and features thereof will more readily apparent from the following description and appended claims when taken with the drawings.

DETAILED DESCRIPTION OF THE INVENTION

In accordance with the invention, a novel technique for velocity measurements (PC-SSFP) combines CINE Phase Contrast (PC) MRI and balanced Steady State Free Precession (SSFP) imaging. Flow encoding is performed without the introduction of additional velocity encoding gradients in order to permit data acquisition with short TR, comparable to repetition times of typical SSFP imaging sequences. Sensitivity to through plane velocities is established by inverting (i.e. negating) all gradients along the slice select direction. Velocity sensitivity (venc) can be adjusted by altering the first moments of the slice select gradients. Disturbances of the SSFP steady state are avoided by acquiring different flow echoes in consecutively (i.e. sequentially) executed scans or partial scans, each over one or more cardiac cycles, using separate steady state preparation periods. In one implementation, a complete scan with one flow sensitivity in the slice direction is followed by another scan with a different flow sensitivity. Comparison of phantom measurements with those from established 2D-CINE-PC MRI demonstrates excellent correlation between both modalities. Results of volunteer examinations exhibit advantages of PC-SSFP, which include the intrinsic high signal to noise ratio (SNR) of balanced SSFP and consequently low phase noise in measured velocities. An additional benefit of PC-SSFP is lower reliance on in-flow dependent signal enhancement, therefore yielding more uniform SNR and better depiction of vessel geometry throughout the whole cardiac cycle in structures with slow and/or pulsatile flow.

The invention permits measurement of through plane velocities using balanced SSFP sequences with inverted gradient switching schemes in the slice selection direction in combination with appropriate sequential sequence timing to preserve the SSFP steady state. As a result, the imaging gradients themselves are used for velocity encoding instead of introducing additional flow encoding gradients. This allows the short repetition times that are crucial for balanced SSFP due to its off-resonance sensitivity. Flexibility with respect to the range of velocity sensitivities was achieved using a combination of rf-pulse variation and optimized gradient waveform design.

Figure 1:
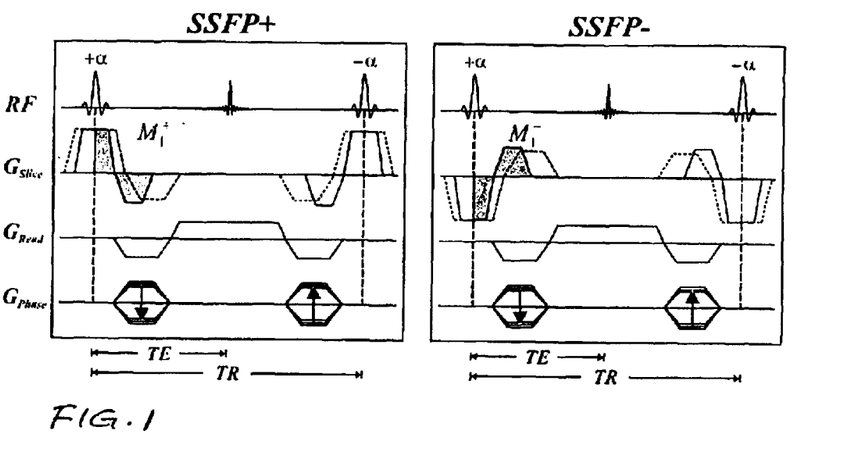
FIG. 1 is SSFP+ and SSFP− sequences for velocity measurements in accordance with the invention.

For a typical phase contrast experiment two measurements with different first moments are necessary to encode flow or motion along a single direction. According to the invention, velocity encoding is performed by data acquisition with two SSFP sequences (denoted as SSFP+ and SSFP−, FIG. 1), which differ only in the sign of all gradients along the slice selection direction. First moments $M_1^+$ and $M_1^-$ associated with the slice selection gradients (gray shade areas, FIG. 1) are thus altered accordingly. For off-center slices the frequency offsets of the rf-pulses have to be adjusted according to slice select gradient alteration for SSFP+ and SSFP− respectively. FIG. 1 shows pulse sequence diagrams for fully balanced SSFP+ and SSFP− sequences. Slice select gradient switching schemes for two different flow sensitivities (venc) are indicated by differently gray shaded areas and solid and dashed lines respectively. The two different first moments $M_1^+$ and $M_1^-$ associated with the sequences are determined by gradient activity starting from the center of the rf-pulse and prior to data acquisition (gray shaded areas).

As in usual PC-MRI processing phase difference images $\Delta\phi(r)$ are proportional to the difference in first moments and directly related to the velocity $v_z$ (r) along the encoding direction:

$$\Delta\phi(r)=v_z(r)\gamma[M_1^+-M_1^-]=2\gamma M_1^+ v_z(r), \tag{1}$$

$$\text{with } M_1 = \int_0^{TE} G_z(\tau)\tau\, d\tau, \tag{2}$$

where the velocity is assumed to be constant over the TE interval and $\gamma$ is the gyromagnetic ratio.

The flow sensitivity (venc), defined as the velocity that produces a phase shift $\Delta\phi$ of $\pi$ radians, is determined by the difference of the first moments of the slice selection gradient waveforms, which is given by twice the first moment of SSFP+ since first moments for SSFP+ and SSFP− differ only in sign.

$$venc = \frac{\pi}{2\gamma M_1^+} \tag{3}$$

Different velocity sensitivities can be realized by lengthening the plateau of the slice selection gradient and adjusting refocusing and prefocussing gradients accordingly while keeping the rf-pulse width constant, as indicated in FIG. 1 by the differently gray shaded areas and solid and dashed lines respectively. In order to generate minimized echo and repetition times, waveform timing was optimized for the slice selection and refocusing gradients similar to methods described by Bernstein et al. Journal of MRI, 1992: 2(5) pp 583–8. For a given rf-pulse and velocity sensitivity (venc), a method was developed for calculating slice selection gradient waveforms with minimized gradient switching times. A detailed description including equations used for waveform generation can be found in the appendix.

Alternatively, venc can be altered by changes in rf-pulse width and/or shape and associated slice select gradient strength.

Here, a combination of both methods for venc adjustment was implemented. For a given velocity sensitivity and slice thickness a rf-pulse, which minimizes TR based on the waveform timing optimization, was selected from a list of possible rf-pulses with different widths and shapes.

Figure 2:
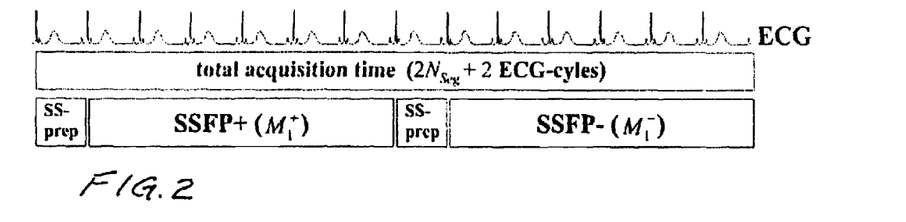
FIG. 2 is sequence timing for PC-SSFP data acquisition in CINE mode in accordance with the invention.

In order to perform time resolved CINE examinations in a single breath-hold, an acquisition scheme as shown in FIG. 2 was implemented. In order to maintain the steady state the two sequences SSFP+ and SSFP− are executed consecutively over several ECG cycles. Each SSFP+/SSFP− imaging segment is preceded by one ECG cycle used for steady state preparation (SS-prep in FIG. 2). Here pulse sequences with inverted slice selection gradients and altered first moments $M_1^+$ and $M_1^-$ are executed in a sequential manner. Steady State Preparation (SS-prep) including an α/2 preparation pulse and dummy TRs for the duration of one ECG cycle was added prior to each SSFP sequence.

Data for the two SSFP+ and SSFP− sequences were collected in a k-space segmented fashion with $N_{VPS}$ phase encoding steps per cardiac cycle [12]. For a given image matrix size of ($N_x \times N_y$), the number of k-space segments is $N_{Seg}=N_y/N_{VPS}$ and the total acquisition time $T_{Acq}$ and temporal resolution $T_{Res}$ are given by ($T_{ECG}$=length of cardiac cycle):

$$T_{Acq}=(2N_{Seg}+2)T_{ECG}, \quad (4)$$

$$T_{Res}=N_{VPS}TR. \quad (5)$$

In a reduction to practice, all measurements were performed on a 1.5T system (Signa CV/i, GE, Milwaukee, Wis.) with a k-space segmented retrospectively gated CINE PC-SSFP pulse sequence and the following parameters: α=50°, TE=1.6 ms, TR=3.6 ms, BW=250 kHz, FOV=320 mm. An imaging matrix of 256×128 in combination with $N_{VPS}$=16 resulted in a temporal resolution of $T_{Res}$=58 ms and a total acquisition time of $T_{Acq}$=18 $T_{ECG}$. Velocity encoding sensitivity (venc) was 155 cm/s using a slice thickness of 8 mm and an rf-pulse duration of $\Delta_{rf}$=800 µs. Different velocity sensitivities were realized by optimized lengthening of the slice selection and refocusing gradients while keeping the rf-pulse width constant (see appendix). All data presented here were acquired using single slice measurements positioned at the iso-center of the magnet.

PC-SSFP measurements were compared to a standard CINE Phase Contrast pulse sequence (2D-CINE-PC) with similar parameters. 2D-CINE-PC data acquisition consisted of a k-space segmented retrospectively gated gradient echo sequence (α=15°, TE=2.5 ms, TR=5.5 ms, BW=125 kHz) with the same venc, imaging matrix, FOV and slice thickness as for PC-SSFP. Since flow encoding was performed in an interleaved manner $N_{VPS}$ of 8 and two ECG cycles for steady state preparation resulted in the same total acquisition time and a similar temporal resolution ($T_{Res}$=88 ms) as for PC-SSFP.

The minimum achievable TR and temporal resolution was shorter for PC-SSFP since no additional gradients are necessary for velocity encoding.

A computer controlled flow pump was used to generate pulsatile flow waveforms in a phantom with two tubes providing flow in opposite directions. In order to analyze the sensitivity of PC-SSFP signal to off-resonance effects and the consequence for phase difference images, measurements with static phantoms and purposely added frequency offsets were performed.

Velocity Sensitivity

Figure 3:
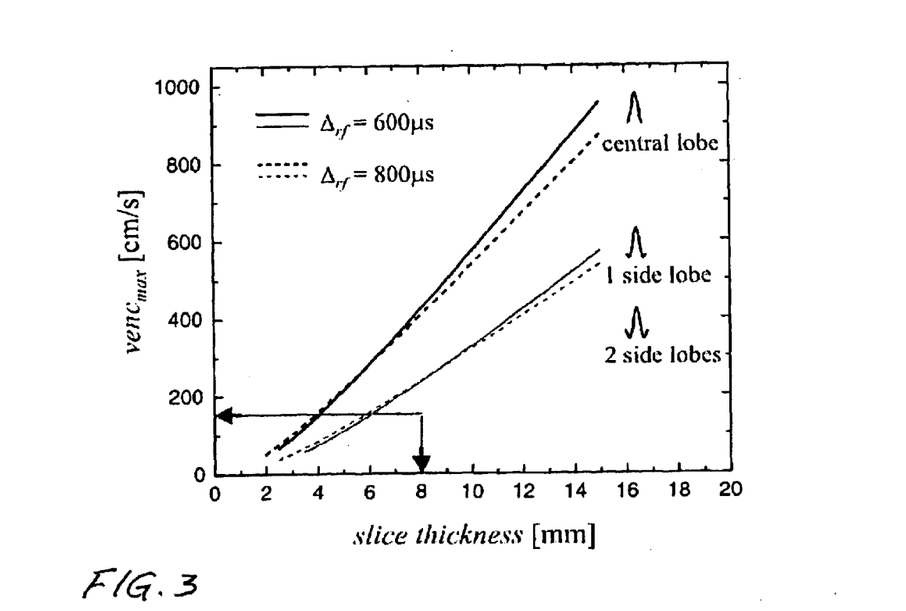
FIG. 3 is a graph illustrating velocity sensitivity limits ($venc_{max}$) as a function of slice thickness for rf-pulses with different width $\Delta rf$ and shape.

For freely variable venc the minimal velocity sensitivity (highest venc, $venc_{max}$) for a given slice thickness was limited by the minimal gradient area necessary for slice selection. Different $venc_{max}$ limits could be achieved by using symmetric sinc-shaped rf-pulses of different length and quality, i.e. number of side lobes. For a particular rf-pulse $venc_{max}$ is a function of the slice thickness used for imaging. This is depicted in FIG. 3 for three different types of rf-pulses each with two different widths $\Delta_{rf}$. A more detailed description of the relationship between $venc_{max}$ and other imaging parameters is given in the appendix.

FIG. 3 illustrates velocity sensitivity limits ($venc_{max}$) as a function of slice thickness for rf-pulses with different width $\Delta_{rf}$ and shape. Note that for each rf-pulse the minimal slice thickness is limited by the gradient performance of the system. The cutoff in the graphs for each rf-pulse correspond to the minimal achievable slice thickness assuming a maximum gradient strength of 40 mT/m. The black arrows indicate the rf-pulse and corresponding venc used for phantom and volunteer measurements presented here.

From FIG. 3, the range of $venc_{max}$ for typical slice thicknesses of 5–10 mm is well matched to the velocity encoding used in typical clinical applications. For thick slices and a given rf-pulse shape, longer pulse width $\Delta_{rf}$ and consequently lower slice select gradient strength leads to higher first moments (see for example equation 10, appendix) and thus smaller values for $venc_{max}$. This behavior is reversed for thinner slices as a result of increased ramp times necessary for the stronger slice select gradient of shorter pulses. This leads to the crossing of the two curves (solid and dashed lines) for each pulse shape in FIG. 3.

Furthermore, any $venc<venc_{max}$ can be realized by the proposed method for altering velocity sensitivities (see FIG. 1 and appendix). Table 1 lists the minimum achievable repetition times TR for different selected vencs based on a slice thickness of 8 mm and the maximum gradient amplitude and slew rate limitations of the SIgna CV/i. Other systems may have different minimum TRs, as is known to one of skill in the art.

TABLE 1

| $\Delta_{rf}$ [µs], shape | venc$_{max}$ [cm/s] | venc$_{max}$ | TR [ms] | | |
|---|---|---|---|---|---|
| | | | venc = 150 cm/s | venc = 100 cm/s | venc = 50 cm/s |
| 600, central lobe | 424 | 3.40 | 4.00 | 4.34 | 5.15 |
| 800, central lobe | 408 | 3.57 | 4.26 | 4.66 | 4.65 |
| 600, 1 side lobe | 236 | 3.48 | 3.70 | 3.97 | 4.82 |
| 800, 1 side lobe | 239 | 3.62 | 3.90 | 4.22 | 4.99 |
| 600, 2 side lobes | 150 | 3.54 | 3.54 | 3.76 | 4.36 |
| 800, 2 side lobes | 158 | 3.70 | 3.70 | 3.97 | 4.65 |

The values in table 1 indicate that TR can be considerably reduced by the appropriate selection of rf-pulse shape and width for a given velocity sensitivity. For velocity sensitivities >100 cm/sec, which are typically used to avoid aliasing for arterial blood flow velocities, TR can be kept <4 ms if a suitable rf-pulse is chosen. If lower vencs are selected, TR increases to values which might be problematic for SSFP imaging. For TR<4 ms, a slice thickness of 8 mm and other sequence parameters as listed above velocity sensitivities in the range of 75 cm/s to 424 cm/s could be realized. The selection of a fixed venc of 150 cm/s (100 cm/s), on the other hand, resulted in selectable slice thicknesses in the range of 3.9–12.0 mm (3.0–11.1 mm) for the same TR constraint.

Flow Phantom Experiments

Figure 4:
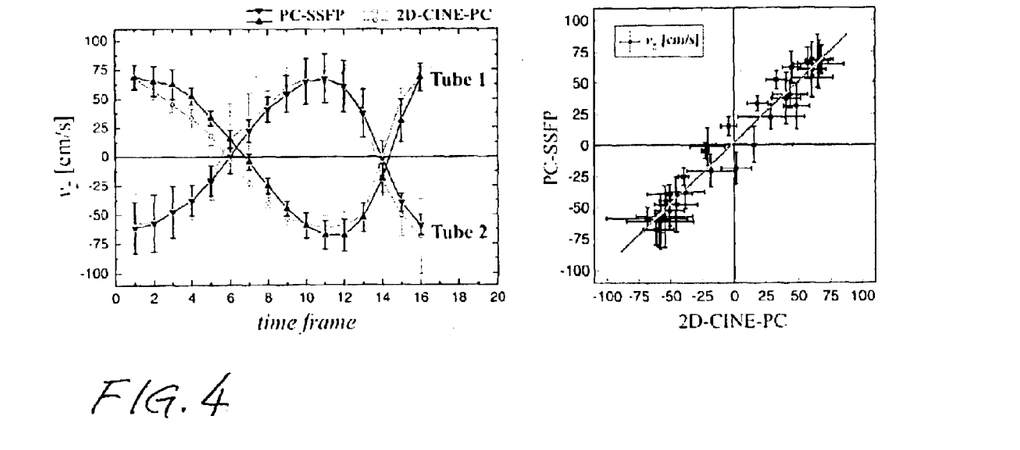
FIG. 4 is graphs illustrating results of quantitative analysis of velocities measured with PC-SSFP and with 2D-CINE-PC.

FIG. 4 shows the quantitative comparison of pulsatile velocities measured with PC-SSFP and 2D-CINE-PC. Time resolved mean velocities ($v_z$) in ROIs representing both flow directions (tube 1 and tube 2) are displayed in FIG. 4 (left) while overall correlation of the results is depicted in FIG. 4 (right). The measured velocity waveforms demonstrate excellent agreement between both methods, which is also reflected by the results of a linear regression (slope=0.98+/−0.04, intercept=1.93+/−1.94, r=0.98). In FIG. 4 data points in the left graph represent the average through plane velocities ($v_z$) within the tube for both flow directions (tube 1 and tube 2) as a function of time for PC-SSFP (rectangles) and 2D-CINE-PC (circles and squares). The graph on the right shows the cumulative results of mean velocities for all time frames and both flow directions. The solid line is the result of a linear regression.

Volunteer Examination

Figure 5:
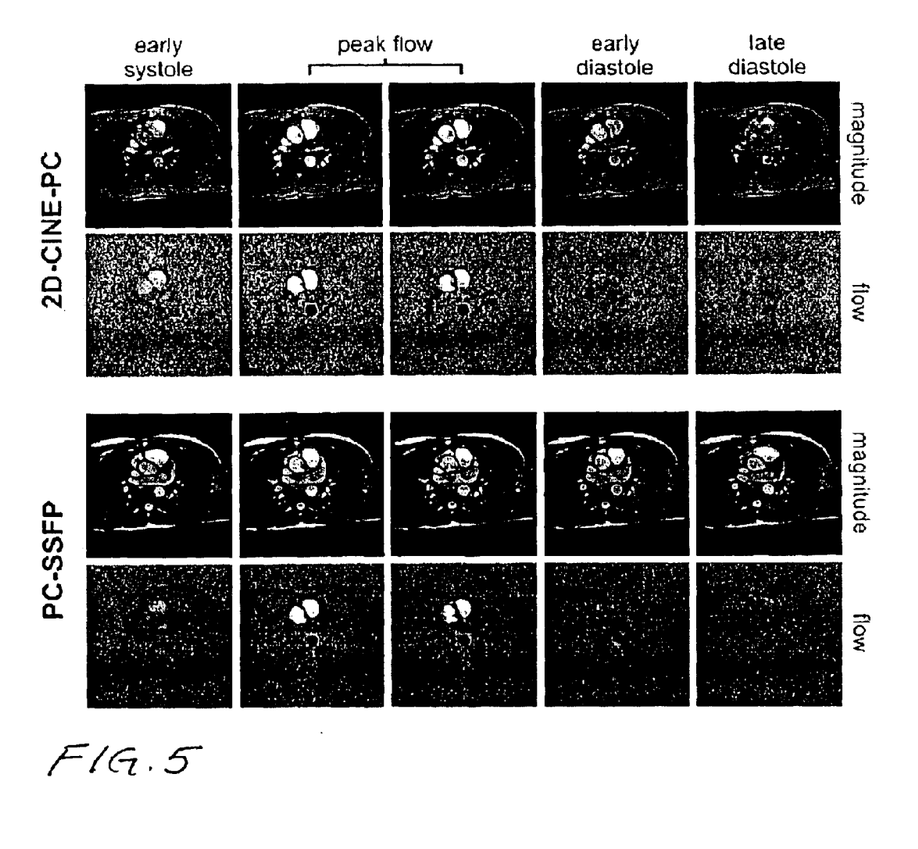
FIG. 5 is magnitude and flow images of different phases of the cardiac cycle in an axial plane on the level of the aortic valve for images acquired with standard phase contrast MRI (2D-CINE-PC on top) and PC-SSFP (on bottom) in accordance with the invention.

FIG. 5 illustrates magnitude and flow images of different phases of the cardiac cycle in an axial plane on the level of the aortic valve for images acquired with standard phase contrast MRI (2D-Cine-PC, top) and PC-SSFP (bottom). The comparison was designed such that both methods employ the same spatial resolution and same total acquisition time (18-sec breath hold measurement). For each technique five axial magnitude and phase difference (flow) images out of 24 retrospectively reconstructed CINE time frames are shown. The cardiac phases (early systole, peak flow, early diastole and late diastole) were selected to illustrate and compare typical characteristics of signal intensity for PC-SSFP and 2D-CINE-PC as a function of time within the ECG cycle.

The 2D-CINE-PC signal shows a strong flow dependence demonstrated by significant signal enhancement during rapid flow in vessels with blood-flow perpendicular to the imaging plane while images during early systole or diastole exhibit poor contrast between the blood and surrounding tissue. In general, blood signal intensity and thus vessel depiction is degraded in cardiac phases with low or no flow. PC-SSFP, on the other hand, demonstrates higher and almost constant signal intensity over the entire cardiac cycle within all vessels and cardiac chambers. Since phase noise in flow images is directly related to inverse SNR in magnitude images, flow quantification with PC-SSFP results in less phase noise and better depiction of vessel geometry throughout the cardiac cycle.

Figure 6:
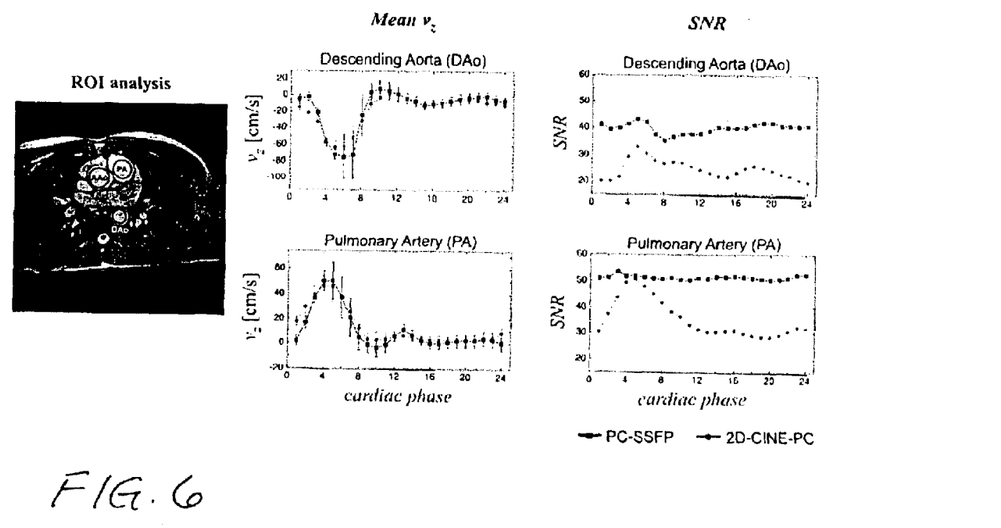
FIG. 6 is an image of a Region of Interest (ROI) along with graphs showing temporal evolution of mean $v_z$ and SNR over 24 reconstructed time frames for PC-SSFP (black squares) and for 2D-CINE-PC (gray circles).

A quantitative analysis of the measured velocities and SNR for both methods is presented in FIG. 6. Mean through plane velocities and SNR were analyzed in 3 regions of interest (ROIs) representing the ascending and descending aorta and the pulmonary artery (FIG. 6, left). The graphs show the mean through plane velocities (mean $v_z$) and the SNR as a function of time frame within the cardiac cycle for the pulmonary artery and the descending aorta. SNR was calculated as mean signal intensity in the magnitude images in the respective ROI divided by the standard deviation in the background noise.

The velocity waveforms demonstrate good agreement between both methods with slightly higher peak velocities and less low pass filtering for PC-SSFP due to higher temporal resolution. From FIG. 6 it is evident that the SNR for PC-SSFP is not only higher but also more constant over the entire cardiac cycle. Conversely, SNR in 2D-CINE-PC is strongly flow dependent and relies heavily on in-flow enhancement.

The mean SNR over the whole cardiac cycle for both 2D-CINE-PC and PC-SSFP as well as the gain in average SNR is summarized in table 2. For all three ROIs a significant increase of the order of 45–60% was seen. Signal increase is higher for the descending aorta due to less inflow-enhancement in standard PC-MRI.

TABLE 2

| | mean SNR | | average |
|---|---|---|---|
| | PC-SSFP | 2D-CINE-PC | SNR gain |
| PA | 51.21 ± 0.75 | 35.20 ± 7.23 | 45% |
| DAo | 39.81 ± 1.93 | 24.42 ± 3.47 | 63% |
| AAo | 42.28 ± 2.43 | 29.27 ± 6.22 | 44% |

Off-resonance Sensitivity

Figure 7:
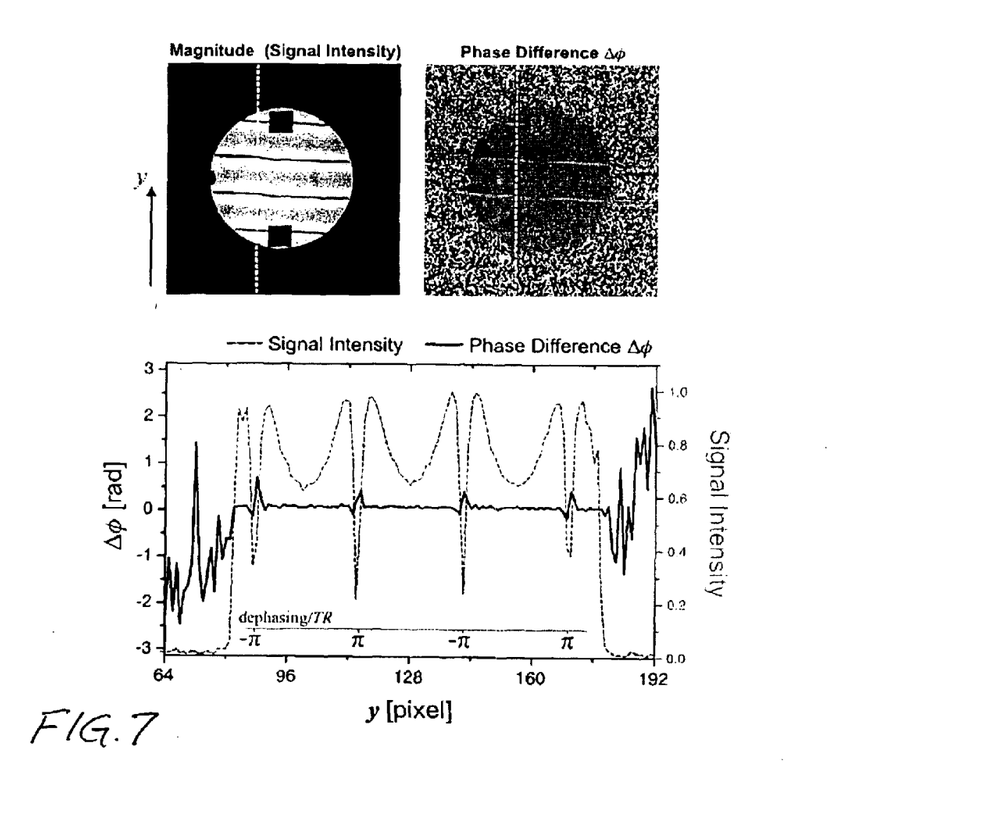
FIG. 7 is magnitude and phase difference images (top) of a phantom with signal evolution plotted for a magnitude image (black line) and phase difference image (gray line).

FIG. 7 shows the results of a PC-SSFP experiment with an additional—deliberately introduced—gradient along y. The magnitude image (top left) demonstrates typical SSFP signal modulation and banding artifacts along that direction. The phase difference image of the same acquisition (top right), however, shows only minor disturbances at the location of the banding artifacts. This is further illustrated by a cross sectional plot along the dashed lines exhibiting considerable signal variation in magnitude images (dashed gray line) but only minor effects in the phase difference images (solid black line). Banding artifacts correspond to a significant drop in signal intensity at locations where the additional gradient introduces a signal dephasing over TR of $+/-\pi$.

The results of the phantom experiments demonstrate that PC-SSFP can be used for through plane velocity measurements. Excellent agreement was found between a standard phase contrast method and our PC-SSFP implementation. Good correlation concerning velocity quantification could be verified. In addition, it was shown that PC-SSFP phase difference images are largely insensitive to off-resonance effects.

For human studies the spatial resolution and number of views per segment could be adjusted such that the whole examination (as shown in FIG. 2) could be performed within a single breath-hold with a total acquisition time comparable to that of standard phase contrast techniques.

The results of volunteer examinations demonstrate the feasibility of PC-SSFP. In comparison to standard Phase Contrast MRI significant improvement in SNR in combination with less in-flow dependency of the PC-SSFP signal can be achieved. Consequently, the PC-SSFP acquisition demonstrated improved phase noise in flow images as well as better and more consistent depiction of vessel geometry. In addition, the improved SNR in magnitude images allows for improved segmentation of blood vessels or heart chambers for all cardiac phases. As a result, errors related to under- or overestimation of vessel or chamber size might be minimized. Due to the high quality of magnitude images along the entire cardiac cycle additional morphological parameters (e.g. aortic diameter as a function of cardiac phase) can be estimated from the same data set.

The method can be extended to measurement of in-plane flow by applying similar gradient inversion strategies to the readout direction. As with the implementation described above, motion sensitivity would be generated by inverting all gradients along the readout direction. Increased velocity encoding sensitivities could be achieved by lengthening the plateau of the readout gradient while keeping the data acquisition window constant and adjusting the prefocussing and refocusing gradients accordingly. Lower flow sensitivities (higher vencs) could be realized by using fractional echoes for data acquisition. In the readout direction, one can perform sequences with different flow sensitivities in an interleaved manner. This is possible because, with a well-tuned system, one can alternate flow sensitivities while maintaining the steady state. This is preferred since motion artifacts can be avoided.

Finally, three directional flow encoding can be accomplished by combining the method presented here with two additional scans with the same in-plane flow encoding gradients but interchanged readout and phase encoding direction or by adding flow encoding lobes to the phase encoding axis.

The achievable velocity sensitivities lie well within the range of typical blood flow velocities although the maximum of selectable vencs is limited by the minimal gradient area needed for slice selection, which might be problematic for thin slices (see FIG. 3). In such a case, larger vencs could be achieved by using asymmetric rf-pulses and consequently less gradient activity between the center of the rf-pulse and data read-out. In principle all venc<$venc_{max}$ can be realized by the proposed method for altering velocity sensitivities. Strong velocity sensitivity, however, will eventually lead to a significant increase in TR, which might be problematic for balanced SSFP imaging.

It is well known that the balanced SSFP steady state signal carries $T_2$ dependent contributions from earlier TRs. Due to the intrinsic first order moment nulling at the time of the rf-pulses, however, phase changes of the SSFP signal related to constant velocities are refocused within each TR at each rf-pulse. Based on the assumption that the underlying flow or motion varies slowly with respect to TR the measured phase difference will therefore only reflect velocity induced phase changes within a single TR and contain no additional signal contaminations from earlier excitations. Since repetition times for PC-SSFP are comparable to those of typical balanced SSFP imaging sequences and usually of the order of a few milliseconds, this should be a valid assumption for usual flow conditions. Even for regions demonstrating high flow PC-SSFP imaging will provide correct results as long as flow changes are slow with respect to TR and the velocity sensitivity covers the range of the underlying blood flow velocities. Further investigation, however, is necessary concerning the performance of PC-SSFP in areas with high acceleration such as stenoses or jet-like regurgitant flow regions. In such cases, on the other hand, the high velocity may rapidly replace the blood within the slice and thus eliminate any phase contaminations from earlier excitations.

The requirement to maintain the balanced SSFP steady state by nulling the zeroth and first moments at the time of each rf-pulse make it difficult to implement interleaved velocity encoding in the slice select direction which would require gradient chopping in neighboring TRs as opposed to the sequential velocity encoding used for our implementation (see FIG. 2). If velocity encoding by gradient inversion in the slice direction is applied in adjacent TRs the resulting pulse sequences are no longer first order moment nulled along the slice encoding direction which leads to considerable flow artifacts. It is thus not obvious how to obtain interleaved velocity encoding in this direction without greatly lengthening TR or violating the need for first order moment nulling. In the readout direction, interleaved flow encoding is feasible.

A potential source of error for PC-SSFP lies in the fact that inverted slice selection gradients are needed for velocity encoding. Any deviation from the ideal slice selection gradient or $B_0$ inhomogeneities may result in different slice positions for SSFP+ and SSFP−.

Figure 8:
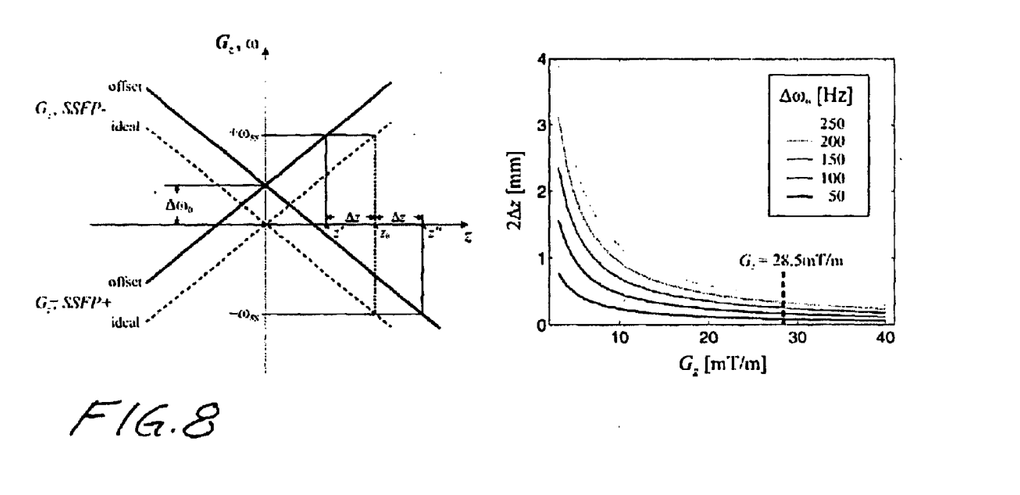
FIG. 8 is plots of slice selection errors for PC-SSFP and simulated slice position differences ($2\Delta z$) for typical slice selection gradient strength $G_z$ and $B_0$ field inhomogeneities $\Delta\omega_0$.

Gradient field non-linearities along the slice select direction (z) will result in consistent distortions for original and inverted gradients (assuming ideal gradient amplifier performance, i.e. no offsets for all gradient polarities), and therefore are of no concern. $B_0$ inhomogeneities, however, pose a more serious problem. The center frequency offset $\omega_{SS}$ of the slice selection pulse for a slice centered at location $z_0$ is calculated as $\omega_{SS}=\gamma G_z z_0$, assuming ideal slice selection gradients $G_z$ and absolute $B_0$ homogeneity ($\Delta B_0=0$). FIG. 8 is a schematic illustration of slice selection errors for PC-SSFP (left) and simulated slice position differences ($2\Delta z$) for typical slice selection gradient strength $G_z$ and $B_0$ field inhomogeneities $\Delta\omega_0$ (right). For ideal gradients (dashed gray lines, left) and respectively adjusted slice selection center frequencies $+\omega_{SS}$ and $-\omega_{SS}$ gradient inversion results in rf-excitation at the same spatial location $z_0$. $B_0$-inhomogeneities introduce a constant frequency offset $\Delta\omega_0$ in the spatially dependent frequencies $\omega(z)$ generated by the original and inverted slice selection gradients (solid black lines, left). As a result slice selection is centered at different spatial locations $z''$ and $z'$ introducing a slice position difference $2\Delta z$ between spins excited with reversed gradients. The left graph illustrates the effect of $B_0$-inhomogeneity on slice selection with inverted gradient polarity as in PC-SSFP. For ideal gradients (dashed gray lines, no additional frequency offset) gradient inversion and simultaneous center frequency alteration leads to the excitation of spins at the same location $z_0$. In the presence of an imperfect shim resulting in an additional frequency offset $\Delta\omega=\gamma\Delta B_0$, however, the truly excited slice positions are shifted to different spatial locations $z'=z_0-\Delta z$ for SSFP+ and $z''=z_0+\Delta z$ for SSFP−. The difference in slice locations between SSFP+ and SSFP− is $2\Delta z=z''-z'=2\Delta\omega_0/\gamma G_z$. Such discrepancies may introduce artifacts and velocity encoding errors since images acquired with different gradient polarities are averaged or subtracted in order to calculate magnitude or flow images, respectively. For usual imaging sequences with identical polarity of the slice selection gradient throughout the scan, the imaging plane is consistently shifted to $z''=z'$ which results in an error in the slice position but no additional artifacts.

Expected slice position errors ($2\Delta z$) for typical $B_0$-inhomogeneities of the order of 50–250 Hz as a function of slice selection gradient strength are shown in FIG. 8 (right). For a given rf-pulse waveform, the error varies with gradient strength and thus slice thickness and decreases for thinner slices. The dashed vertical line indicates absolute value of the strength of the slice selection gradient used for the experiments presented here (8 mm slice, $G_z$=28.5 mT/m). Even for strong $B_0$-inhomogeneities the slice position difference is less than 1 mm and the potential error thus smaller than 15% of the slice thickness.

For all experiments presented here axial slices positioned at the center of the magnet were used and no visible errors in slice locations were seen. Due to increased $B_0$-inhomogeneities away from the magnet center, however, measurements using oblique slices at off-center locations are expected to be more sensitive to slice selection errors and require further investigation.

In accordance with the invention, PC-SSFP has the potential to considerably improve flow measurements mainly due to better depiction of vessel geometry throughout the whole cardiac cycle in combination with less noise in the flow images. While the invention has been described with reference to specific embodiments, the description is illustrative of the invention and is not limiting the invention. Various modifications and applications may occur to those skilled in the art without departing from the true spirit and scope of the invention as defined by the appended claims.

APPENDIX

Optimized Slice Selection Gradient Waveforms.

In this section equations used for the design of PC-SSFP sequences with optimized gradient timing, which minimize $TE$ and $TR$, are derived. Slice selection gradient waveforms need to be optimized with respect to minimal gradient switching times for given, user selected, velocity sensitivity ($venc$). All calculations presented here are related to SSFP+ waveforms but easily adapted to inverted gradients.

Figure 9:
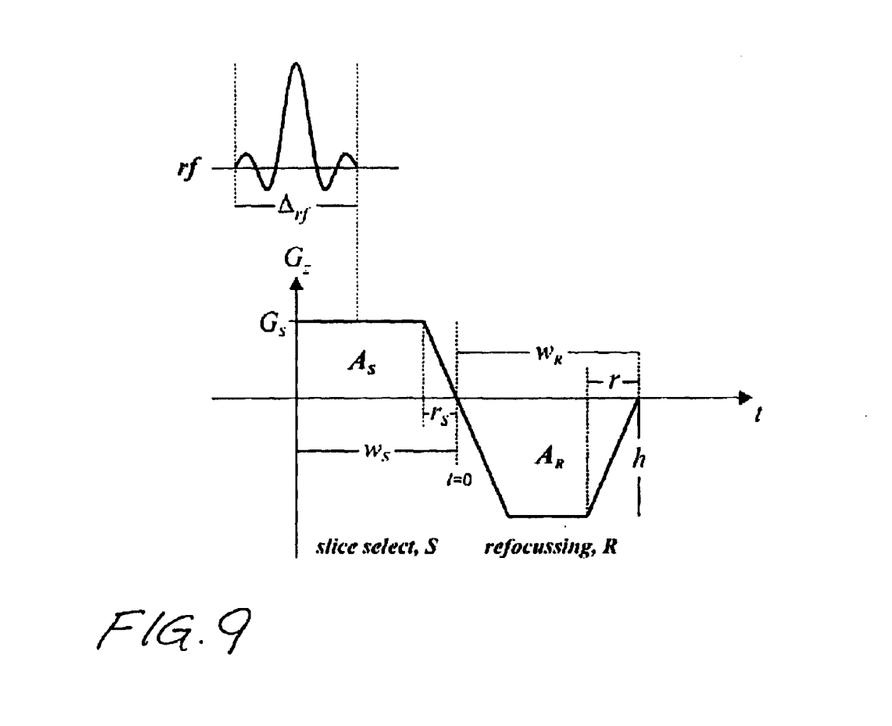
FIG. 9 is a schematic representation of the slice select gradient waveform for SSFP+ and parameters used for the derivation of optimal waveform timing.

Parameters characterizing a typical slice selection gradient waveform for a symmetric rf-pulse are shown in figure 9. For all calculations it is assumed that the rf-pulse is played out only during the plateau of the slice select gradient.

For any given rf-pulse shape and width the amplitude $G_S$ of the slice selection gradient is determined by the desired slice thickness. The length $2(w_S-r_S)$ of the plateau of the slice select lobe, however, needs to be determined according to the selected $venc$ but must be equal or longer than the duration of the rf-pulse. For slice selection the net area under the slice select and refocusing gradient has to vanish such that $$A_S = A_R, \quad \text{with} \quad A_S = G_S(w_S - \frac{1}{2}r_S). \tag{6}$$

In order to minimize gradient switching times the minimum possible ramp time (for given Gradient amplitude $G_S$)

$$r_S = r\frac{G_S}{h} \tag{7}$$

is utilized, provided that the performance of the MR-system is characterized by the maximum gradient strength $h$ and minimal rise time $r$ from zero to $h$.

Assuming a trapezoidal lobe of positive area $A_R$ for the refocusing gradient, its minimum width $w_R$ is given by $$w_R = \frac{A_R}{h} + r. \tag{8}$$

For small areas ($A_R < hr$) and triangular lobes equation (8) is to some extent sub-optimal. In those cases, however, minimum $TE$ will most likely be determined by another gradient axis. It can be shown that whenever the zeroth moment $M_0$ vanishes, i.e. for gradient waveforms with zero net area, any temporal origin ($t=0$) can be selected to calculate the first moment $M_1$. Moreover, the first moment for a symmetric gradient lobe (such as the refocusing lobe) centered at $t$ is $M_1 = M_0 t$. Given that $A_S = A_R$ and thus $M_0=0$ for the slice selection waveform $t=0$ can be chosen at the intersection of slice select and refocusing lobe (as depicted in figure 10). The nonzero first moment $M_1^+$ associated with the waveform is thus given by $$M_1^+ = M_1^S + M_1^R = M_1^S - \frac{1}{2} w_R A_R \qquad (9)$$

Since the slice selection lobe is not symmetric its first moment $M_1^S$ has to be calculated explicitly according to equation (2):

$$M_1^S = \frac{1}{6} G_S (r_S^2 - 3w_S^2) \qquad (10)$$

Combining equations (9) and (10) and using equations (6), (7) and (8) to eliminate $w_S$, $w_R$ and $r_S$ yields $$-\frac{1}{2}\left[\frac{1}{G_S} + \frac{1}{h}\right] A_R^2 - \frac{1}{2} r \left[\frac{G_S}{h} + 1\right] A_R + \frac{1}{24} \frac{r^2}{h^2} G_S^3 - M_1^+ = 0. \qquad (11)$$

Equation (11) can be solved for $A_R$ and results in only one physically relevant (real and positive) solution given by $$A_R = -\frac{1}{2} r G_S + \frac{\sqrt{3 G_S h (r^2 G_S^3 + 3 h r^2 G_S^2 + 3 h^2 r^2 G_S - 24 M_1^+ h^2)}}{6 h \sqrt{G_S + h}}. \qquad (12)$$

Since $G_S$, $r$ and $h$ are known and according to equation (3) $M_1^+$ can be directly related to the desired velocity sensitivity, equation (12) can be used to derive the optimized refocusing gradient area for any given $venc$. Once $A_R$ is calculated, the widths $w_S$ and $w_R$ can be determined using equations (6) and (8) respectively.

The minimal achievable velocity sensitivity $venc_{max}$ is reached if $2(w_S-r_S)$ is equal to the width $\Delta_{rf}$ of the rf-pulse. Using a similar derivation as for the waveform calculations above and solving for the velocity sensitivity associated with the minimal possible width $\Delta_{rf}$ of the plateau of the slice selection gradient results in the following equation that allows the calculation of $venc_{max}$ for any given slice thickness and symmetric rf-pulse.

$$venc_{max} = \frac{6h^3}{\gamma G_S ((G_S + h) 3 h^2 \Delta_{rf}^2 + (G_S + h)^2 6 r h \Delta_{rf} + (3 G_S^2 + 8 G_S h + 6 h^2) G_S r^2)} \qquad (13)$$

Higher $vencs$ could be achieved using the proposed method and non-symmetric rf-pulses with smaller refocusing areas.

What is claimed is:

1. A method of acquiring signal for motion in a slice through an object using magnetic resonance imaging, said method comprising the steps of:
   a) acquiring first signals from a slice using a first slice selection gradient and a first phase encoding gradient,
   b) acquiring second signals from the slice using a second phase encoding gradient and a second slice selection gradient which is an inversion of the first slice selection gradient whereby the two slice selection gradients have different first moments and
   c) obtaining signals of motion through the slice from the first signals and a second signals depending on difference in phase between the first signals and the second signals, the signals of motion being proportional to motion velocity through the slice (along the slice encoding direction), and wherein the phase difference in these signals $\Delta\Phi(r)$ is related to the velocity component $v_z(r)$ through the slice and first moments $M_1^+$ and $M_1^-$ as follows:

$$\Delta\phi(r) = v_z(r)\gamma[M_1^+ - M_1^-] = 2\gamma M_1^+ v_z(r),$$

with $$M_1 = \int_0^{TE} G_z(\tau)\tau \, d\tau,$$

where $\gamma$ is the gyromagnetic ratio.

2. The invention as defined by claim 1 wherein flow sensitivity (venc) is the velocity that produces a phase shift $\Delta\phi$ of $\pi$ radians and is given by $$venc = \frac{\pi}{2\gamma M_1^+}.$$

3. The invention as defined by claim 1 wherein said motion signals are obtained at multiple points in a cardiac cycle.

4. A method for obtaining motion signals in an object comprising the steps of:
   a) placing the object in a static magnetic field,
   b) applying an rf magnetic excitation to the object,
   c) concurrently with and after step b) applying to the object a slice selection gradient having positive and negative values,
   d) after step b) applying to the object a phase encoding gradient,
   e) or step d) reading magnetic resonance signals for the selected slice,
   f) after step e) applying an inverted phase encoding gradient and an inverted readout and slice sole n gradient for zeroth and first order moment nulling,
   g) steps a) through f) with the positive and negative values of the slice selection gradient in step c) being inverted, and
   h) processing the magnetic resonance signals read in step c) and read in step g) to obtain motion signals.

5. The method as defined by claim 4 wherein the motion signals are proportional to difference first moments of the slice selection gradients before and after inversion of the positive and negative values and is proportional to motion velocity through the slice (along the slice encoding direction).

6. The method as defined by claim 4 wherein the motion signals are phase difference images $\Delta\phi(r)$, related to velocity $v_z(r)$ and first moments $M_1^+$ and $M_1^-$ as follows:

$$\Delta\phi(r) = v_z(r)\gamma[M_1^+ - M_1^-] = 2\gamma M_1^+ v_z(r),$$

$$M_1 = \int_0^{TE} G_z(\tau)\tau \, d\tau,$$

where $\gamma$ is the gyromagnetic ratio.

7. The method as defined by claim 6 wherein flow a sensitivity (venc) is the velocity that produces a phase shift $\Delta\phi$ of $\pi$ radians and is given by $$venc = \frac{\pi}{2\gamma M_1^+}.$$

8. The method as defined by claim 7 wherein the application of rf magnetic excitation pulses is timed to a cardiac cycle.

9. The method as defined in claim 6 wherein the rf moments $M_1^+$ and $M_1^-$ are proportional to the width of a slice gradient.

10. A method of acquiring signal for motion in an object using magnetic resonance imaging, said method comprising the steps of:
    a) acquiring first signals from using a first readout gradient and a first phase encoding gradient,
    b) acquiring second signals using a second readout gradient and a second phase encoding gradient which is an inversion of the first readout gradient whereby the two readout gradients have different first moments and
    c) obtaining signals of motion through from the first signals and second signals depending on the difference in phase between the first signals and the second signals, the signals of motion being proportional to differences in the first moments of the readout gradient and proportional to motion in the readout direction, and wherein the phase difference in these signals $\Delta\phi(r)$ is related to the velocity component $v_z(r)$ in the readout direction and moments $M_1^+$ and $M_1^-$ as follows:

$$\Delta\phi(r) = v_z(r)\gamma[M_1^+ - M_1^-] = 2\gamma M_1^+ v_z(r),$$

with $$M_1 = \int_0^{TE} G_z(\tau)\tau \, d\tau,$$

where $\gamma$ is the gyromagnetic ratio.

11. The invention as defined by claim 10 wherein flow sensitivity (venc) is the velocity that produces a phase shift $\Delta\phi$ of $\pi$ radians and is given by $$venc = \frac{\pi}{2\gamma M_1^+}.$$

12. The invention as defined by claim 10 wherein said motion signals are obtained at multiple points in a cardiac cycle.

* * * * *